United States Patent [19]

Farace et al.

[11] Patent Number: 4,721,925

[45] Date of Patent: Jan. 26, 1988

[54] MICROMECHANICAL ELECTRONIC OSCILLATOR

[75] Inventors: Louis P. Farace, Mesa; Adrian S. King, Chandler, both of Ariz.

[73] Assignee: Motorola, Inc., Schaumburg, Ill.

[21] Appl. No.: 932,851

[22] Filed: Nov. 20, 1986

[51] Int. Cl.⁴ ............................................. H03B 5/30
[52] U.S. Cl. .................................. 331/154; 331/156; 368/168
[58] Field of Search ................ 331/154, 156; 368/155, 368/160, 168; 310/311, 348

[56] References Cited

U.S. PATENT DOCUMENTS 3,917,966 11/1975 Mizutani et al. ................ 368/168 X
3,969,640 7/1976 Staudte .......................... 331/156 X Primary Examiner—Eugene R. LaRoche
Assistant Examiner—Robert J. Pascal
Attorney, Agent, or Firm—Maurice J. Jones, Jr.; Eugene A. Parsons

[57] ABSTRACT

A microminiature oscillator that uses the movement of a mechanical structure placed on an etched silicon chip to control the frequency of a pulse used as a time base in electronic applications.

9 Claims, 6 Drawing Figures

MICROMECHANICAL ELECTRONIC OSCILLATOR

BACKGROUND OF THE INVENTION

This invention generally pertains to oscillators capable of providing an accurate time base in numerous electronic applications. In prior art devices, macroscopic crystals, which have a known natural frequency when a voltage is applied, are used for a time base. Macroscopic oscillators, however, have the disadvantageous quality of significant mass and stiffness which cause frequency shifts in environments where high gravitational fields are present, such as spinning projectiles. Since one significant application of such oscillators is in the proximity fuzes of these projectiles, a new oscillator is needed. Furthermore, due to the fragile nature of the crystal material used in such prior art oscillators, shock isolation is required in many applications. This adds unnecessary weight to the device and also makes production more complicated and expensive.

SUMMARY OF THE INVENTION

The present invention pertains to an electromechanical oscillator which is microminiature in size. The silicon wafer is etched to form a cavity over which a micromechanical structure is suspended and partially attached to the wafer in such a manner that the structure can oscillate. On its unattached portions, the micromechanical structure has contacts which can connect bonding pads on the silicon wafer. Circuitry exists on the wafer to electrically induce the micromechanical structure to oscillate. The oscillation rate of the structure controls the frequency rate of a series of out put pulses. In some instances, initiation circuits are used to control when the oscillator will begin converting dc voltage into a series of output pulses with a known, accurate frequency.

It is an object of the present invention to provide a new and improved oscillator which is microminiature in size and therfrom more precise than prior art devices which have a greater mass and greater stiffness.

It is a further object of the present invention to provide a new and improved oscillator that does not require shock isolation of the device.

It is still another object of the present invention to provide a new and improved oscillator which minimizes the effect of inertial and environmental influences.

These and other objects of this invention will become apparent to those skilled in the art upon consideration of the accompanying specification, claims, and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
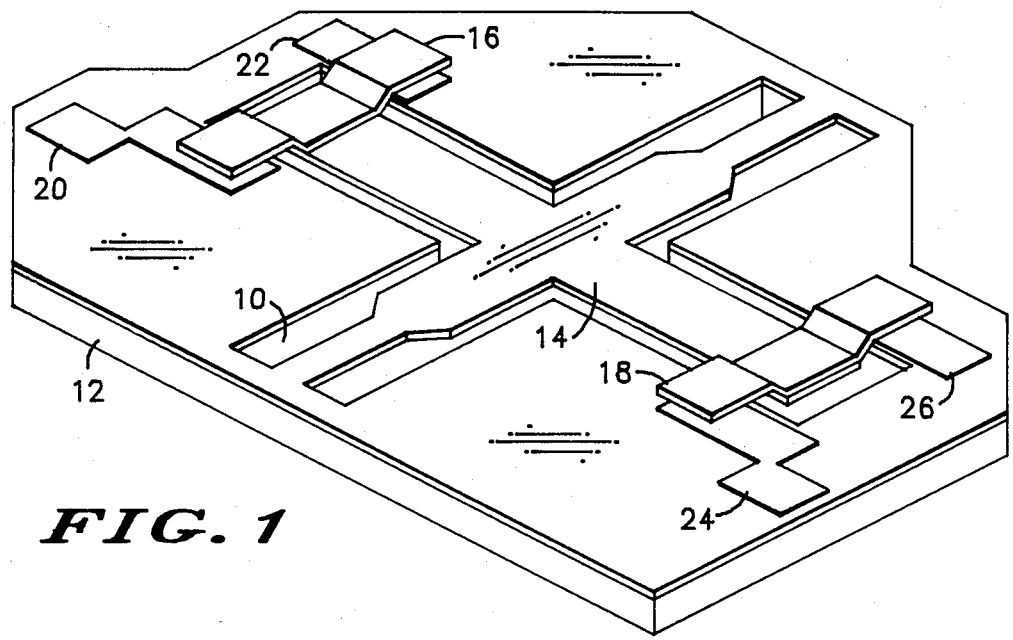
FIG. 1 is a perspective view of a fully assembled electromechanical oscillator embodying the present invention.

Referring specifically to FIG. 1, a cavity 10 is etched on silicon chip 12. A cross-shaped microstructure 14 is suspended over cavity 10 and partially attached to the silicon chip itself. Contact 16 is connected to one attached end of microstructure 14 and contact 18 is connected to the other attached end of microstructure 14. It should be clear to those skilled in the art that microstructure 14 will most often be made of glass and contacts 16 and 18 will frequently be made of gold and take the form of gull wing contacts. Bonding pads 20, 22, 24 and 26 are positioned such that contact 16 can join bonding pad 20 and bonding pad 22 and contact 18 can join bonding pad 24 and bonding pad 26. Obviously, more than four bonding pads can be used if more than two wires need to be kept separated and then joined together.

Figure 2:
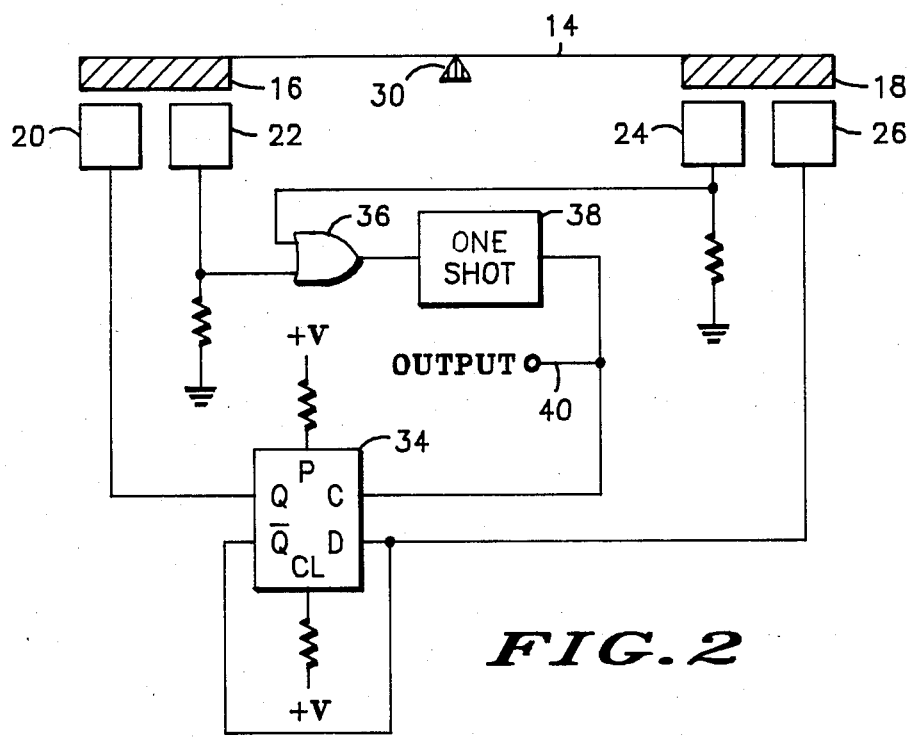
FIG. 2 is a block-schematic diagram of the electrical circuitry used in the oscillator of FIG. 1.

Referring specifically to FIG. 2, a supply voltage $+V$ powers D-C flip-flop 34. The output (Q) of a flip-flop 34 is supplied to bonding pad 20 and the negated output ($\bar{Q}$) of flip-flop 34 is connected to both bonding pad 26 and the D input of flip-flop 34. Bonding pad 22 and bonding pad 24 form the inputs of a two input OR gate 36. The resultant signal of OR gate 36 is attached to a pulsing device 38 and controls the frequency rate of the output pulses generated by device 38. Pulsing device 38 may be an edge-triggered one-shot which outputs a logic high signal for a predetermined time whenever the signal of OR gate 36 switches from one logic level to another logic level. However, if the precise timing of the oscillation of microstructure 14 is known, pulsing device 38 may be a flip-flop or other type of pulse switching device. The output pulses generated by device 38 are connected to both the C input of flip-flop 34 and an output line 40. It should be apparent to those skilled in the art that the pulses at output line 40 are at a constant frequency and also that these pulses commence as soon as the supply voltage is applied to D-C flip-flop 34. Also, it should be clear that the frequency of the output pulses is almost solely dependent on the mechanical movement of the structure since the time required for the microstructure to switch positions is much greater than the electrical propogation delay time. Pulsing device 38 may be eliminated completely if there is no need to control the duty cycle of the resultant signal of OR gate 36. A duty signal is defined as the amount of time a signal is high divided by the period of the signal. The circuitry of FIG. 2 is ideal for use in watches or other devices where a continuous and accurate time base is needed.

Figure 3:
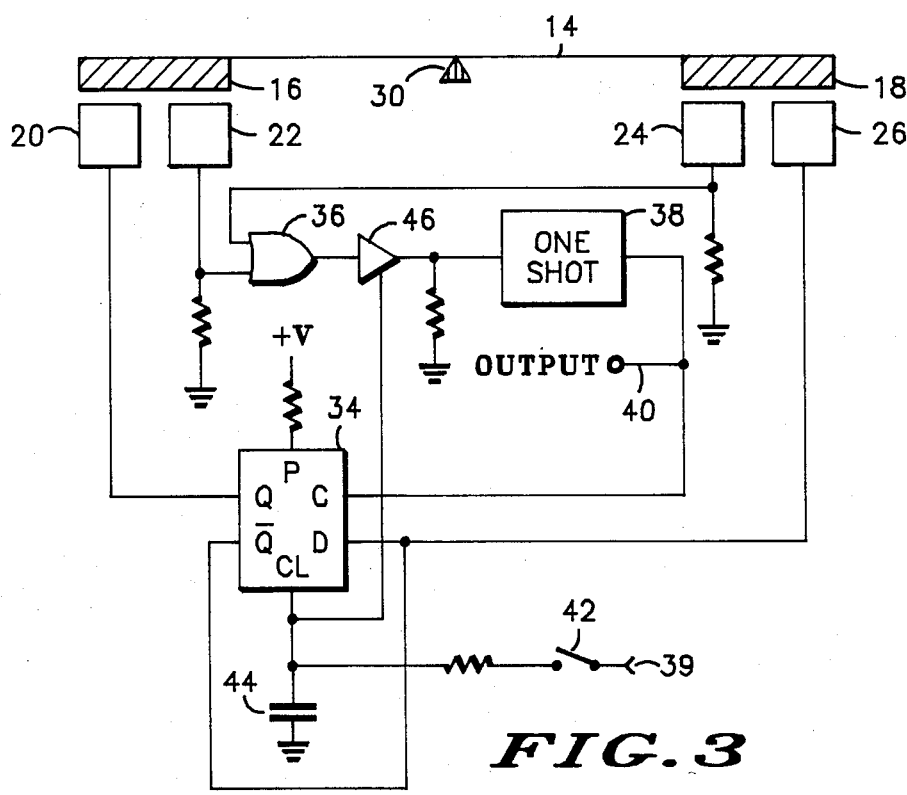
FIG. 3 is a block-schematic diagram similar to FIG. 2 which also has initiating means to activate the device at a predetermined time.

In some devices, such as proximity fuzes, a time base that is activated as soon as a D-C supply voltage is applied is inadequate. Therefore, some sort of initiating means is required for the time base to have any utility. Referring specifically to FIG. 3, initiating means are attached to an apparatus similar to that shown in FIG. 2. A power on reset voltage is applied to a line 39 and controlled by a switch 42. It should be clear to those skilled in the art that switch 42 may be controlled by various means such as a mechanical force, an electrical pulse, etc. When switch 42 is placed in its short circuit activation mode, a grounded capacitor 44 is charged. This charge is channeled into a tri-state buffer 46 which then allows the output signal of OR gate 36 to pass into pulsing device 38 thus commencing the activation of the oscillator. Before initiation, while switch 42 was in its open circuit non-activation mode, no charge was on capacitor 44 and tri-state buffer 46 would not allow the output signal from OR gate 36 to pass to pulsing device 38.

Referring back to FIGS. 2 and 3, it should be clear that a voltage will alternately appear by only one of bonding pads 20 and 26. When the voltage is at bonding pad 20, contact 16 connects bonding pads 20 and 22. This passes a logic high signal to OR gate 36 which triggers an output pulse from pulsing device 38. Alternatively, when the voltage is at bonding pad 26, contact 18 connects bonding pads 26 and 24. This passes a logic high signal to OR gate 36 which triggers an output pulse from pulsing device 38. In the period between when one contact is connecting two bonding pads, none of the bonding pads are connected. Therefore, the output signal of OR gate 36 is a logic low signal. Since pulsing device 38 is an edge-triggered device, the change in the signal passing from OR gate 36 from high to low triggers another pulse from pulsing device 38. The pulse of output line 40 is thus at a frequency twice the beat rate of micromechanical structure 14. This frequency concept can be easily understood by referring specifically to FIG. 4.

Figure 4A:
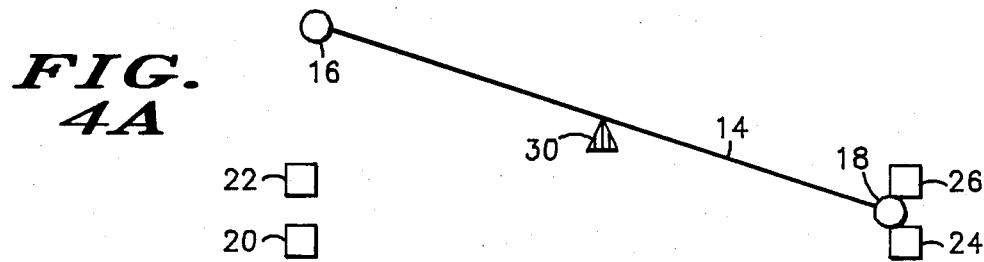
FIGS. 4a, 4b, and 4c are explanatory diagrams for a description of the operation of the oscillator.
Figure 4B:
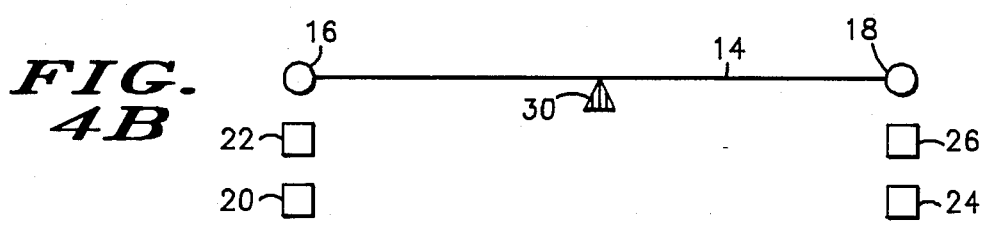
Figure 4C:
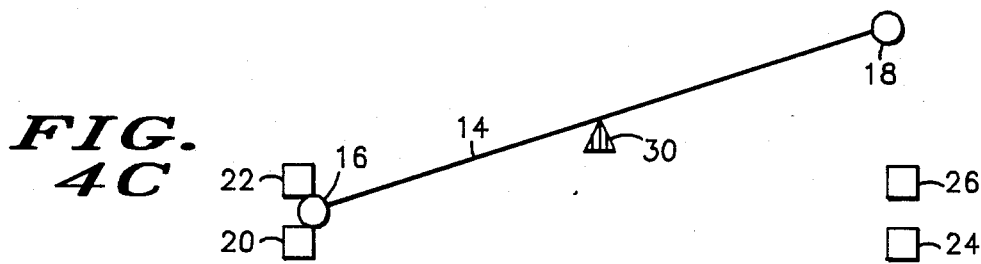

FIG. 4a shows contact 18 connecting bonding pads 24 and 26. At this time, the input of OR gate 36 connected to bonding pad 24 is logically high and therefore the output signal of OR gate 36 is also high. This positive edge triggers an output from pulsing device 38. The output pulse of pulsing device 38 is inputed into the C input of flip-flop 34 resulting in the signal travelling to bonding pad 26 and the opposite signal travelling to bonding pad 20 being switched. With the voltage now at bonding pad 20, micromechanical structure 14 is attracted in such a manner as to want to move along its imaginary fulcrum 30 to the position of FIG. 4c. However, before this can occur, the transition state of FIG. 4b is incurred. When micromechanical structure 14 is in its position as shown in FIG. 4b, both inputs to OR gate 36 are in the low state and thus a low signal is outputted. This negative edge triggers a pulse from pulsing device 38. Thus another pulse appears at output line 40. When micromechanical structure 14 finally does reach its position of FIG. 4c, a logic high signal is passed from bonding pad 22 to an input of OR gate 36. The output signal of the OR gate is thus a positive going edge which once again triggers an output pulse from pulsing device 38 to output line 40. Similarly, the transition of micromechanical structure 14 from its position in FIG. 4c to the position of FIG. 4a also generates two pulses to output line 40.

Thus, an embodiment of an accurate time base for electronic applications has been shown where the electric pulse is controlled by physical motion of a micromechanical structure. It should be apparent that the electric pulse can be supplied directly from the bonding pads instead of from a pulsing device which is frequency controlled by the oscillations of the micromechanical structure. The utilization of a pulsing device in the preferred embodiment allows for a more reliable device which is less likely to burn out than if no pulsing device is implemented. We desire it to be understood, therefore, that this invention is not limited to the particular form shown and we intend in the appending claims to cover all modifications which do not depart from the spirit and scope of this invention.

What is claimed is:

1. An electromechanical oscillator comprising:
   a silicon wafer;
   a cavity formed within said silicon wafer;
   a cross-shaped micromechanical structure suspended over said cavity wherein said micromechanical structure has a first end and a second end positioned opposite to each other and attached to said wafer and said micromechanical structure also has a third end and a fourth end positioned opposite to each other and free from said wafer;
   first and second bridging contacts with said first contact placed on said third end and said second contact placed on said fourth end;
   a plurality of bonding pads positioned on locations of said silicon wafer where said first and second contacts bridge said cavity; and
   electrical circuitry capable of inducing oscillations in said micromechanical structure.

2. An electromechanical oscillator as recited in claim 1 wherein said cross-shaped micromechanical structure is made of glass.

3. An electromechanical oscillator as recited in claim 1 wherein said first and second bridging contracts are gold, gull wing contacts.

4. An electromechanical oscillator as recited in claim 1 wherein said cavity is cross-shaped.

5. An electromechanical oscillator as recited in claim 1 wherein said plurality of bonding pads consists of a first bonding pad and a second bonding pad located near said third end on opposite sides of said cavity and a third bonding pad and a fourth bonding pad located near said fourth end on opposite sides of said cavity.

6. An electromechanical oscillator as recited in claim 5 further comprising an edge-trigged one-shot coupled to said plurality of bonding pads to generate output pulses.

7. An electromechanical oscillator as recited in claim 6 wherein said electrical circuitry includes a D-C flip-flop possessing a C input and a D input, an output (Q) of said flip-flop connected to said first bonding pad, a negated output (Q) of said flip-flop connected to both said D input and said third bonding pad, an OR gate with a first input supplied by said second bonding pad and a second input supplied by said fourth bonding pad, an output of said OR gate passing to said edge-triggered one-shot, and a connection that transfers an output of said one-shot to said C input.

8. An electromechanical oscillator as recited in claim 7 wherein said electrical circuitry further includes initiating means to commence said oscillations of said micromechanical structure at a predetermined time.

9. An electromechanical oscillator as recited in claim 8 wherein said initiating means consists of a power on reset voltage, a switch to control the passage of said power on reset voltage, a capacitor placed between a grounded terminal and said switch and a tri-state buffer positioned between said OR gate and said one-shot and further inputted by a line connected between said capacitor and said switch.

* * * * *